United States Patent
Hofmann et al.

(10) Patent No.: US 6,191,459 B1
(45) Date of Patent: *Feb. 20, 2001

(54) ELECTRICALLY PROGRAMMABLE MEMORY CELL ARRAY, USING CHARGE CARRIER TRAPS AND INSULATION TRENCHES

(75) Inventors: Franz Hofmann, München; Wolfgang Krautschneider, Hohenthann; Josef Willer, Riemerling; Hans Reisinger, Grünwald, all of (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/780,488

(22) Filed: Jan. 8, 1997

(30) Foreign Application Priority Data

Jan. 8, 1996 (DE) .............................. 196 00 423

(51) Int. Cl.[7] .......................... H01L 29/76; H01L 29/94; H01L 31/062; H01L 31/113

(52) U.S. Cl. .......................... 257/390; 257/331; 438/259; 438/270

(58) Field of Search .................... 257/330, 331, 257/390; 438/259, 270

(56) References Cited

U.S. PATENT DOCUMENTS

| 4,047,974 | 9/1977 | Harari . | |
|---|---|---|---|
| 4,774,556 | 9/1988 | Fujii et al. . | |
| 5,180,680 | 1/1993 | Yang . | |
| 5,321,289 | * 6/1994 | Baba et al. .......................... | 257/331 |
| 5,453,637 | 9/1995 | Fong-Chun et al. . | |
| 5,460,989 | * 10/1995 | Wake .................................. | 438/259 |
| 5,705,415 | * 1/1998 | Orlowski et al. .................... | 438/259 |
| 5,721,442 | * 2/1998 | Hong .................................. | 257/316 |

FOREIGN PATENT DOCUMENTS

| 30 32 364 A1 | 4/1982 | (DE) . | |
|---|---|---|---|
| 0 562 257 A1 | 9/1993 | (EP) . | |
| 3-1574 | 1/1991 | (JP) . | |
| 4-226071 | * 8/1992 | (JP) .................................. | 257/390 |
| 5-251669 | 9/1993 | (JP) . | |
| 5-326976 | 12/1993 | (JP) . | |

OTHER PUBLICATIONS

S.N. Sze, "Semiconductor Devices", John Wiley & Sons, pp. 486–490, as mentioned on page 2 of the specification.

"Memory effects of silicon–implanted oxides for electrically erasable programmable read–only memory applications", Ming–yin Hao et al., Appl. Phys. Lett. 62 (13), Mar. 29, 1993, pp. 1530–1532.

"A MOSFET with Si–implanted Gate–$SiO_2$ Insulator for Nonvolatile Memory Applications", Hori et al., IEDEM 92–469, pp. 17.7.1–17.7.4.

(List continued on next page.)

Primary Examiner—Olik Chaudhuri
Assistant Examiner—Howard Weiss
(74) Attorney, Agent, or Firm—Herbert L. Lerner; Laurence A. Greenberg; Werner H. Stemer

(57) ABSTRACT

An electrically programmable memory cell array is formed of memory cells, which include a vertical MOS transistor. The MOS transistor has a gate dielectric of a material with charge carrier traps. The memory cells are disposed along opposite edges of striplike, parallel insulation trenches. The width and spacing of the insulation trenches are preferably identical. The space required per memory cell of the memory cell array is $2F^2$, where F is the minimum structural size in the technology employed. The memory cells are programmed by selectively injecting electrons into the gate dielectric.

6 Claims, 5 Drawing Sheets

OTHER PUBLICATIONS

"A Novel MONOS Nonvolatile Memory Device Ensuing 10–Year Data Retention after $10_7$ Erase/Write Cycles", Minami et al., IEEE Transactions on Electron Devices, vol. 40, No. 11, Nov. 1993, pp. 2011–2017.

"Vertical EEPROM Cell", Technical Disclosure Bulletin, vol. 35, No. 4B, Sep. 1992, pp. 130–131.

"Yield and Reliability of MNOS EEPROM Products", Kamigaki et al., IEEE Journal of Solid–State Circuits, vol. 24, No. 6, Dec. 1989, pp. 1714–1722.

\* cited by examiner

ELECTRICALLY PROGRAMMABLE MEMORY CELL ARRAY, USING CHARGE CARRIER TRAPS AND INSULATION TRENCHES

BACKGROUND OF THE INVENTION

Field of the Invention

For many electronic systems, memories are needed into which the data can be written in fixed fashion, once and for all, in digital form. Such memories are known as OTP memories, among other names.

For large amounts of data, such as the digital storage of music or photographs, in particular, plastic disks, so-called compact disks, coated with aluminum are often used as memories. These disks have two kinds of dotlike indentations in the coating, which are assigned to the logical values of 0 and 1. The information is digitally stored in the arrangement of these indentations. The indentations are generated with the aid of a laser, for instance. This means that the compact disks are writeable once and for all.

To write or read a compact disk, the disk is mechanically rotated in a read/write unit. The dotlike indentations are scanned as the information is read via a laser diode and a photo cell. Typical scanning rates are 2×40 kHz. To write the information, the laser diode is operated at higher energy, causing a change in the absorbent layer of the compact disk and thereby forming an indentation. Approximately 5 Gbits of information can be stored on one plastic disk.

The read/write unit includes moving parts that wear mechanically, take up comparatively much volume, permit only slow data access, and consume large amounts of current. Moreover, the read/write unit is vulnerable to jarring and is therefore suitable for mobile systems only to a limited degree.

Electrically programmable semiconductor-based memories, especially of silicon, and known as EEPROMs or flash memories, are often used for storing smaller quantities of data. In electrically programmable memory cell arrays, the storage of the information is usually accomplished by providing, between the gate and the channel region of the MOS transistors, a floating gate that can be acted upon by an electrical charge or a double layer of $SiO_2$ and $Si_3N_4$ as a gate dielectric, at whose boundary layer electric charge carriers can be firmly captured at traps. The threshold voltage of the MOS transistor is dependent on the charge located at the floating gate or the adhesion points. This property is utilized for the electric programming (see for example S. M. Sze, Semiconductor Devices, John Wiley & Sons, pp. 486–490).

In readout of the memory cell array, the individual memory cells are selected via a word line. The gate electrode of each of the MOS transistors is connected to a respective word line. The input of each MOS transistor is connected to a reference line and the output is connected to a bit line. In the reading operation, it is assessed whether a current is flowing through the transistor or not. The logical values of 0 and 1 are assigned accordingly.

Technologically, the storage of 0 and 1 in these memories is accomplished in that the MOS transistors each have different threshold voltages, depending on the information stored in them.

These known silicon memories typically have a planar layout. This requires minimal surface area per memory cell, on the order of about 6 to 8 $F^2$, where F is the smallest feasible Structural size for the particular technology employed. Planar read-only silicon memories are thus limited, in 0.4 $\mu$m technology, to memory densities of around 1 bit/$\mu m^2$.

SUMMARY OF THE INVENTION

It is accordingly an object of the invention to provide an electrically programmable memory cell array and process for producing it, which overcomes the above-mentioned disadvantages of the heretofore-known devices and methods of this general type, which provides increased memory density and which can be produced with only a few production steps and a high yield. It is a further object to propose a suitable process for producing such a memory cell array.

With the foregoing and other objects in view there is provided, in accordance with the invention, an electrically programmable memory cell array, comprising:

a semiconductor substrate having a main face, and a cell field with a plurality of memory cells disposed on the main face of the semiconductor substrate;

the memory cells including at least one MOS transistor disposed vertically relative to the main face, the MOS transistor having a gate dielectric formed of a material with charge carrier traps.

In other words, the memory cell array of the invention includes a cell field with memory cells in a semiconductor substrate, preferably of monocrystalline silicon, or in a silicon layer of an SOI substrate. The memory cells include a vertical MOS transistor which has a gate dielectric of a material with charge carrier traps. These traps have the properties of trapping charge carriers and especially electrons. For the electrical programming, the MOS transistors are wired in such a way that charge carriers corresponding to the information to be stored enter the gate dielectric and are trapped by the traps.

The programming of the memory cell array is done after production by injecting electrons. This can be done by either Fowler-Nordheim tunneling or by hot electron injection.

By reversing the polarities in the Fowler-Nordheim tunneling, charge carriers can be removed from the traps, thereby changing the programming of the memory cell array.

To store data in digital form, the MOS transistors are programmed in such a way that they have two different threshold voltages. If the read-only memory cell array is to be used for majority logic, then the gate dielectric is acted upon in programming, by corresponding voltage and time conditions, with different charge quantities in such a way that the MOS transistors, depending on the information entered, have more than two different threshold voltages.

In accordance with an added feature of the invention, the gate dielectric is embodied as a multiple layer, in which at least one layer is provided which, in comparison with at least one further layer in the multiple layer, has an increased charge carrier trapping cross section. The traps are localized at the boundary face between two layers. Preferably, the dielectric multiple layer includes an $SiO_2$ layer, an $Si_3N_4$ layer, and an $SiO_2$ layer (so-called ONO). Alternatively, the gate dielectric, in its form as a multiple layer, may comprise other materials, where the layer having the increased charge carrier trapping cross section for instance comprises $Si_3N_4$, $Ta_2O_5$, $Al_2O_3$ or $TiO_2$, and the adjacent layer comprises $SiO_2$, $Si_3N_4$ or $Al_2O_3$. The multiple layer may also have more than three layers, or fewer than three layers.

In accordance with an additional feature of the invention, the gate dielectric may include a dielectric layer, for instance of $SiO_2$, in which foreign atoms, such as W, Pt, Cr, Ni, Pd, Si or Ir are incorporated. The incorporated foreign atoms can be incorporated by implantation, by addition upon an oxidation, or by diffusion. The incorporated foreign atoms in this case form the traps.

In accordance with a further feature of the invention, a plurality of substantially parallel striplike insulation trenches are provided in the cell field. The insulation trenches extend over the entire cell field. The memory cells are each disposed on opposed edges of the insulation trenches. The face of the memory cells overlaps the respective edge.

Striplike doped zones, doped with opposite conductivity to the semiconductor substrate, are disposed on the bottom of the insulation trenches and on the main face of the semiconductor substrate, in each case between adjacent insulation trenches.

The striplike doped zones extend parallel to the insulation trenches over the entire cell field. The vertical MOS transistors of the memory cells are embodied such that one striplike doped zone extending on the bottom of an insulation trench and one striplike doped zone disposed between the insulation trench and the adjacent insulation trench on the main face together each form one of the source/drain zones of the MOS transistor. The gate dielectric and the gate electrode of the MOS transistor are disposed in a hole that borders the edge of the insulation trench and extends as far as the interior of the insulation trench. This hole is filled with the gate dielectric and a gate electrode.

Word lines are disposed on the main face and extend crosswise to the insulation trenches. The word lines are each connected to gate electrodes of vertical MOS transistors disposed below the respective word line.

The striplike doped zones that are disposed on the bottom of the insulation trenches and between adjacent insulation trenches on the main face of the semiconductor substrate are used for readout of the memory cells as a bit or reference line. The memory cell to be assessed is selected via the word line. What is assessed is whether a current does or does not flow between the associated striplike doped zones.

In accordance with again an added feature of the invention, the spacing between adjacent insulation trenches is chosen such that it is essentially equal to the width of the insulation trenches. In this case, the hole in the memory cells preferably extends over the width of each insulation trench. Each two memory cells are disposed on opposed edges of a trench and share a hole, whose width in the direction vertically to the course of the insulation trenches is equivalent to the width of the trenches. The memory cell face extends vertically to the course of the insulation trenches, in each case from the middle of the insulation trench as far as the middle of the spacing from the adjacent insulation trench. If the width of the insulation trenches is selected in accordance with the minimum structural width F in the technology employed, and if the width of the word lines and spacing of the word lines are likewise chosen to correspond to the minimum structural width F in the technology employed, then a space requirement of $2F^2$ is the result for the memory cell. If a minimum structural width of $F=0.4\,\mu m$ is the basis, then a memory density of about 3.1 bits/$\mu m^2$ is attained in the read-only memory cell array.

With the above and other objects in view there is also provided a corresponding process with which the read-only memory cell array of the invention is produced: a doped zone is first formed on the main face of the semiconductor substrate in the region of the cell field. Next, an etch stop layer (polysilicon or nitride) is preferably applied. Then, using a trench mask, trenches are etched, creating the striplike doped zones between adjacent insulation trenches on the main face by structuring the doped zone. The striplike doped zones are formed on the bottom of the trenches by ion implantation. The main face is protected between adjacent trenches by the trench mask. To avoid additional doping of the side walls of the trenches by stray ions, it is advantageous to provide the side walls of the trenches with spacers, for example of $SiO_2$, prior to the ion implantation.

After the implantation to form the striplike doped zones on the bottom of the trenches, the trenches are filled with insulating material, such as $SiO_2$.

After the trenches have been filled, the memory cells are produced. To that end, a photoresist mask is created, which leaves the main face of the semiconductor substrate exposed only at those points where a hole for a pair of memory cells is to be created. In an anisotropic dry etching process, the holes are etched at the edge of the insulation trenches. The semiconductor surface is laid bare in the process at the edge. The hole extends into the interior of the insulation trench. Parallel to the insulation trench, the hole is preferably defined in accordance with the width of the word lines. The hole extends as far as the surface of the striplike doped zone on the bottom of the insulation trench. The semiconductor surface in the hole is provided with a gate dielectric of a material that has traps. The hole is then filled up with a gate electrode.

In accordance with a further mode of the invention, an etch stop layer is provided under the trench mask that is structured in accordance with a trench mask prior to the trench etching. The etch stop layer is made of such a material that the insulating material of the insulation trenches can be etched selectively to the etch stop layer. The structured etch stop layer acts jointly with the photoresist mask as an etching mask in the etching of the holes. It is also considered advantageous that in the etching of the holes with the aid of the etch stop layer, the underlying highly doped zone is not removed. The width of the insulation trenches can therefore be adjusted to suit the minimum structural width F. The photoresist mask has striplike structures that extend crosswise to the insulation trenches. The width of each of the structures in the photoresist mask is equivalent to the minimum structural width F. Hence it is not critical how the photoresist mask is adjusted with respect to the insulation trenches. The etch stop layer and the photoresist mask act jointly as an etching mask in the formation of the holes.

Other features which are considered as characteristic for the invention are set forth in the appended claims.

Although the invention is illustrated and described herein as embodied in an electrically programmable memory cell array, and process for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
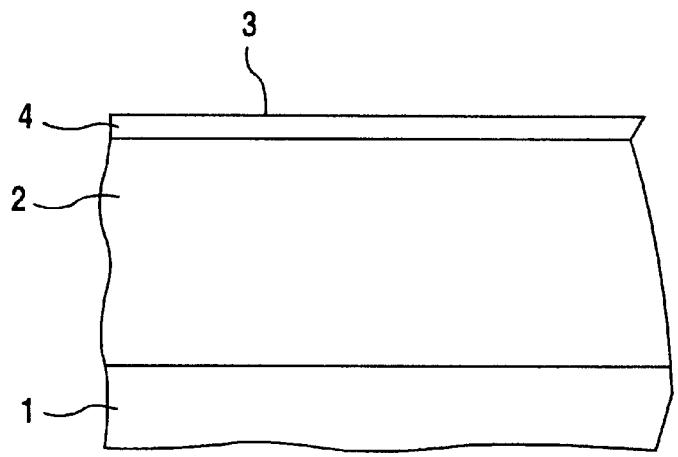
FIG. 1 is a partial section through a substrate with a doped zone in the cell field.

Referring now to the figures of the drawing in detail and first, particularly, to FIG. 1 thereof, there is seen a substrate 1 of monocrystalline silicon, for instance with p-doping, with a dopant concentration of $5 \times 10^{15}$ cm$^{-3}$. A p-doped well 2 with a dopant concentration of $2 \times 10^{17}$ cm$^{-3}$ is created by implantation and ensuing tempering. A stray oxide 20 nm thick is deposited over the entire surface (not shown) in a CVD TEOS process. Next, a photoresist mask (not shown) is created on a main face 3 of the substrate 1, which defines a region for a cell field and a periphery. The photoresist mask covers the region for the periphery, while the main face 3 is bare in the region intended for the cell field.

By implantation at 50 keV, $5 \times 10^{15}$ cm$^{-2}$, an n$^+$-doped zone 4 is created, which has a dopant concentration of $1 \times 10^{21}$ cm$^{-3}$ and extends on the main face 3 over the region for the cell field.

The photoresist mask is removed, and a tempering step follows to activate the dopants. The n$^+$-doped zone 4 has a depth of approximately 200 nm. The p-doped well has a depth of 2 $\mu$m.

The stray oxide is removed by wet chemical processes, and an SiO$_2$ layer 5 is applied over the entire surface by thermal oxidation, in a thickness of, for instance, 60 nm. The oxidation is carried out for instance at 800° C., since at a low oxidation temperature the highly doped n$^+$-doped zone 4 oxidizes more strongly than the weakly doped zone. An etch stop layer 6 is applied to the SiO$_2$ layer 5, being deposited in a CVD process for instance from Si$_3$N$_4$ or polysilicon. The etch stop layer 6 is created in a thickness of 100 nm, for instance.

Figure 2:
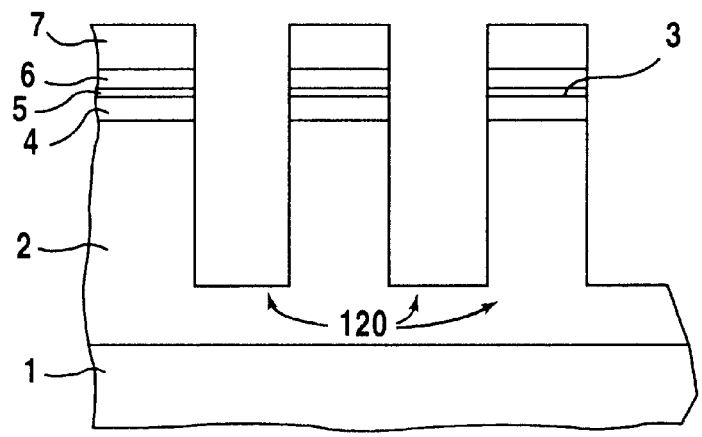
FIG. 2 is a similar section through the substrate with a trench mask after the etching of trenches.

Next, to form a trench mask 7, an SiO$_2$ layer is deposited 300 nm thick by a TEOS process and structured with the aid of photolithographic methods by anisotropic dry etching, for instance with CHF$_2$ and O$_2$ (see FIG. 2).

By anisotropic dry etching, next, the etch stop layer 6 and the SiO$_2$ layer 5 are structured in accordance with the trench mask 7. The etching of the etch stop layer 6 is effected with CHF$_3$ and O$_2$, if this layer comprises Si$_3$N$_4$, and with HBr and Cl$_2$, if it is of polysilicon. The SiO$_2$ layer 5 is etched with CHF$_3$ and O$_2$. After the removal of a photoresist mask that was applied to structure the trench mask 7, trench etching is performed. The trench etching is done in an anisotropic dry etching process, for example using HBr, Ag, O$_2$, and NF$_3$. This creates trenches 120, which have a depth of 0.6 $\mu$m, for instance. The trenches 120 extend over one block of the cell field. They have a length of 250 $\mu$m, for instance, and a width of 0.4 $\mu$m, for instance. Adjacent trenches 120 are disposed at a spacing of 0.4 $\mu$m in the cell field. The trenches 120 extend essentially parallel. By way of example, 64 parallel trenches are created in the block of the cell field 5.

Figure 3:
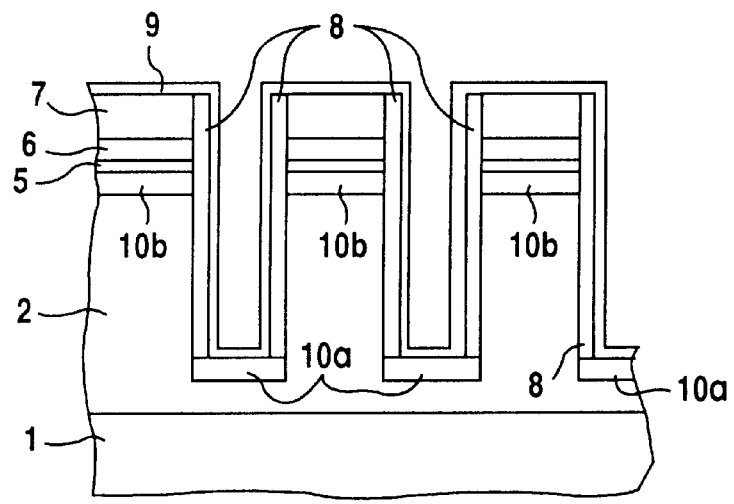
FIG. 3 is a similar view after the formation of striplike doped zones on the bottom of the trenches.

By conformal deposition of a TEOS-SiO$_2$ layer in a thickness of 60 nm and ensuing anisotropic dry etching with CHF$_3$ and O$_2$, SiO$_2$ spacers 8 are created (see FIG. 3) at perpendicular edges, particularly of the trenches 120 and of the trench mask 7.

Next, a stray oxide layer 9 is deposited to a thickness of 20 nm over the entire surface using a TEOS process. A non-illustrated photoresist mask is created, which covers the periphery and leaves the cell field exposed. An ion implantation is performed, in which n$^+$-doped striplike zones 10a are formed on the bottom of the trenches 120. The photoresist mask is stripped, and the doped zones 10a are activated by a tempering step. A dopant concentration of $10^{21}$ cm$^{-3}$, for instance, is established in the striplike doped zones 10a. On the main face 3 of the semiconductor substrate 1, between adjacent trenches 120, striplike doped zones 10b are created in the trench etching process by structuring the n$^+$-doped zone 4.

Next, the trench mask 7 is removed. The removal of the trench mask 7 is effected for instance with Hf steam (Excalibur system) or in an Hf dip. On removal of the trench mask 7, the stray oxide layer 9 and the SiO$_2$ spacers 8 are removed as well. In this process, the surfaces of the p-doped well 2 are laid bare in the trenches 120. To improve the quality of these crystal surfaces, an SiO$_2$ layer in a thickness of 20 nm is created by thermal oxidation. For the sake of simplicity, this SiO$_2$ layer is not shown in the drawings.

Figure 4:
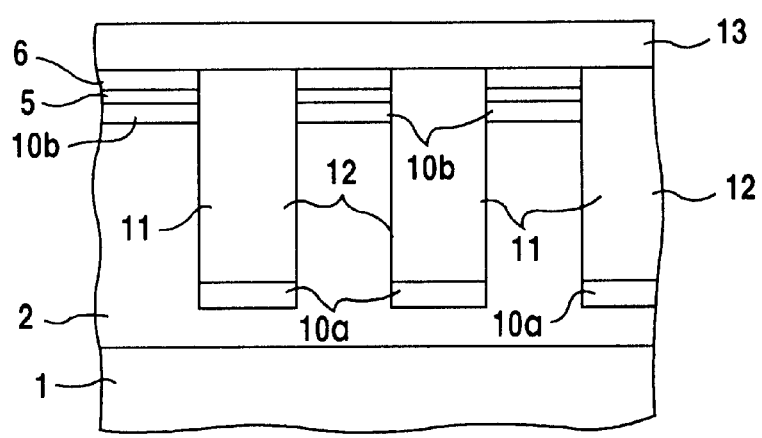
FIG. 4 is a similar view after the trenches have been filled with insulating material and a photoresist mask has been formed.

Next, the trenches 120 are filled to a thickness of 800 nm, for instance, by deposition of a TEOS-SiO$_2$ layer. By back etching with CHF$_3$ and O$_2$, the components of the TEOS-SiO$_2$ layer above the main face 3 are removed. The back etching stops at the etch stop layer 6. In this process step, the trenches 120 have been provided with a trench filling 11 of SiO$_2$. The trenches 120 and the trench filling 11 together form insulation trenches 12 (see FIG. 4). In a tempering step, for instance at 900° C. and for 10 minutes, the trench filling 11 is densified. This changes the etching properties of the SiO$_2$.

A photoresist mask 13 is created, which covers the cell field. Using the photoresist mask 13 as an etching mask, the etch stop layer 6 is removed in the region of the periphery and in the region of the contacts to the bit lines at the edge of the cell field. Then the photoresist mask 13 is stripped.

Figure 5:
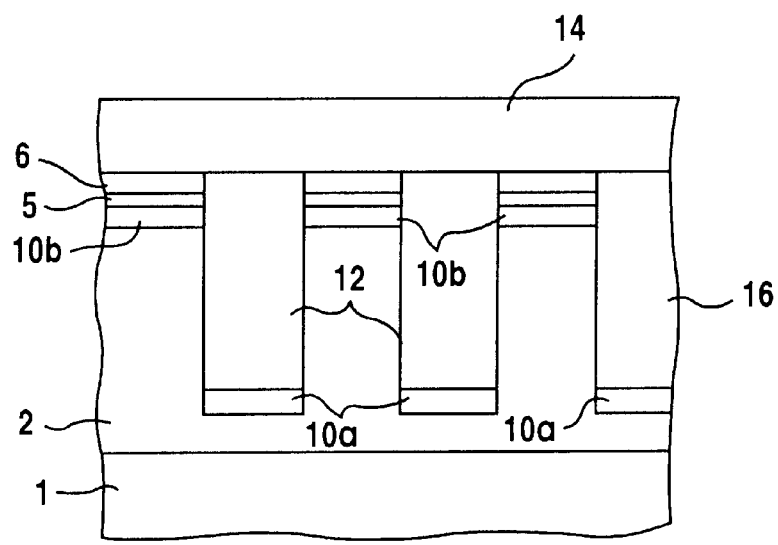
FIG. 5 is a partial section taken along the line V—V in FIG. 6 showing the substrate after an etching of holes, in which a photoresist mask with striplike openings and a structured etch stop layer act jointly as a mask.
Figure 6:
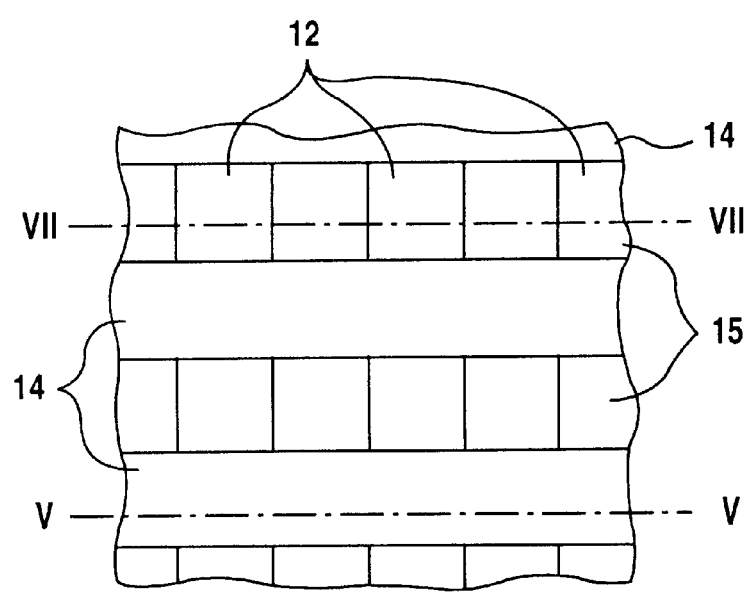
FIG. 6 is a partial plan view onto the structure of FIG. 5, wherein the line V—V indicates the section of FIG. 5 and the line VII—VII indicates the section of FIG. 7.

A photoresist mask 14 is created over the entire surface (see FIG. 5 and the plan view in FIG. 6). The photoresist mask 14 has striplike openings 15, which extend crosswise to the insulation trenches 12. The openings 15 in the photoresist mask 14 have a substantially rectangular cross section parallel to the main face 3, with a width equivalent to a minimum structural width of F=0.4 $\mu$m, for instance, a length equivalent to the length of the cell field, and a spacing between adjacent openings 15 equivalent to a minimum structural width of F=0.4 $\mu$m, for instance. The periphery is covered by the photoresist mask 14.

Figure 7:
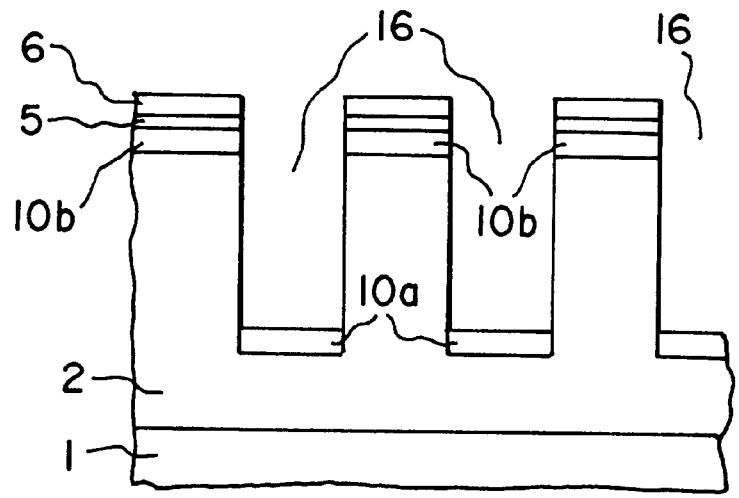
FIG. 7 is a partial section through the substrate taken along the line VII—VII in FIG. 6.

In an anisotropic dry etching process, which selectively attacks the trench filling 11 down to the etch stop layer 6, holes 16 are etched into the insulation trenches 12. If the etch stop layer 6 is of Si$_3$N$_4$, then the etching is done with C$_2$F$_6$ and C$_3$F$_8$. If the etch stop layer 6 is of polysilicon, then the etching is done with HBr, Cl$_2$ and Ag. The etching is continued until 700 nm of SiO$_2$ have been removed. The holes 16 then extend as far as the surface of the striplike doped zone 10a that is disposed on the bottom of the respective insulation trench 12. Since the structured etch stop layer 6 and the photoresist mask 14 jointly act as an etching mask, the dimensions of the hole 16 at right angles to the course of the insulation trenches 12 through the width of the insulation trenches 12 is defined by the width of the insulation trenches 12 and at right angles to the course of the striplike openings 15 by the width of the striplike openings 15. This makes it uncritical how the photoresist mask 14 is adjusted. The semiconductor surface is laid bare on both side walls and on the bottom of the hole 15 (see FIG. 7).

Next, the photoresist mask 14 is removed. In an Hf dip, etching products that have deposited on the walls of the holes 16 in the anisotropic etching are removed. To improve the semiconductor surface, a thermal sacrificial oxide, for instance 10 nm thick, is then created and subsequently removed by wet chemical processes.

Figure 8:
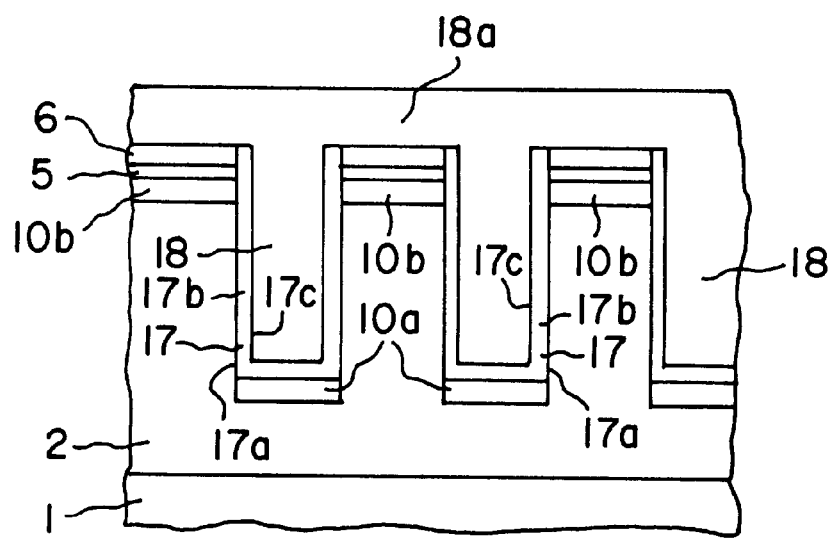
FIG. 8 is a similar view of the substrate after the formation of a gate dielectric, the generation of a doped polysilicon layer, and after structuring the doped polysilicon layer in word lines.

Referring now to FIG. 8, a gate dielectric 17 is then created on bared semiconductor surfaces in the holes 16. The gate dielectric 17 is formed of a material with a high trap density for charge carriers injected into the dielectric.

By way of example, the gate dielectric 17 is formed by a dielectric multiple layer in which at least one layer is provided that has an increased charge carrier trapping cross section in comparison with at least one further layer of the multiple layer. Preferably, the dielectric multiple layer includes one SiO$_2$ layer 17a, one Si$_3$N$_4$ layer, and one SiO$_2$ layer 17c (so-called ONO). The layer thicknesses in the multiple layer are dimensioned such that with respect to its capacitance the multiple layer corresponds to a layer of thermal SiO$_2$ with a thickness of 10 nm, for instance. To that end, layer thicknesses of 4 nm each for the SiO$_2$ layers and 5 nm for the Si$_3$N$_4$ layer are necessary.

Alternatively, the gate dielectric 17 may comprise a multiple layer of other materials, in which the layer with the increased charge carrier trapping cross section for instance comprises Si$_3$N$_4$, Ta$_2$O$_5$, Al$_2$O$_3$ or TiO$_2$, and the adjacent layer comprises SiO$_2$, Si$_3$N$_4$ or Al$_2$O$_3$. The gate dielectric 17 may also include a dielectric layer, for instance of SiO$_2$, in which foreign atoms, such as W, Pt, Cr, Ni, Pd, Si or Ir are embedded. The embedded foreign atoms may be incorporated by implantation, by addition upon an oxidation, or by diffusion.

Next, a doped polysilicon layer 18 is created, in a thickness of 400 nm. The doped polysilicon layer 18 is deposited undoped, for instance, and then n-doped by implantation or diffusion, for instance after POCl coating. Alternatively, the doped polysilicon layer 18 is created by in-situ-doped deposition. The doped polysilicon layer 18 fills up the holes 16 completely.

The doped polysilicon layer 18 is then structured with the aid of photolithographic processes in such a way that word lines 18a are created (see FIG. 8) in the region of the cell field. The portion of the doped polysilicon layer 18 disposed in the holes 16 acts as a gate electrode for vertical transistors, which are formed from the doped striplike zones 10a, 10b that adjoin the respective hole 16, the intervening portion of the p-doped well 2, and the gate dielectric 17. The threshold voltage prior to electrical programming by injection of electrons into the gate dielectric 17 of these vertical MOS transistors is specified via the doping of the p-doped well 2.

The word lines 18a extend substantially at right angles to the insulation trenches 12. They have a width corresponding to a minimum structural width F and are disposed at a spacing of F=0.4 μm, for instance. As a result of the spacing of adjacent word lines 18a, memory cells adjacent one another along one edge of an insulation trench 12 are insulated from one another. In the region of the cell field, 64 word lines 18a, for instance, are disposed parallel side by side. The gate electrodes of the vertical MOS transistors are connected to the respective word line 18a as a requisite of production.

For finishing the memory cell array, after the production of lateral transistors in the periphery, which are used for switching the memory cell array, a planarizing intermediate oxide layer, for instance of boron phosphorous silicate glass, is deposited over the entire surface, and contact holes are opened in it. Contact holes are opened, among other places, to the word lines 18a, to the striplike doped regions 10a that are disposed on the bottom of the insulation trenches 12, and to the striplike doped zones 10b that are disposed on the main face 3 to the adjacent insulation trenches 12. The contact holes are filled with tungsten, for instance. This is followed by the creation of a metallizing plane, for instance by deposition and structuring of an aluminum layer. Finally, a passivation layer is applied. These latter standard steps are not individually shown for simplicity.

For programming the vertical MOS transistors, electrons are injected into the gate dielectric 17. This is done for instance with hot electrons, which are created under certain voltage conditions in the corresponding transistor itself. The electrons are caught in the traps in the gate dielectric 17 and thus shift the threshold voltage of the vertical MOS transistor. In this way, the threshold voltages of the vertical MOS transistors are adjusted to two different values in accordance with digital information stored in memory.

In the memory cell array produced according to the invention, the memory cell is adjusted by the "virtual ground" principle. Each of the striplike doped zones 10a, 10b is assigned to two rows of memory cells. One pair of striplike doped zones 10a, 10b, which are composed of mutually adjacent doped zones 10a on the main face and 10b on the bottom, is unequivocally assigned to one row of memory cells. On readout of the read-only memory cell array, the current flow between a striplike doped zone 10a on the bottom of an insulation trench and an adjacent striplike doped zone 10b on the main face 3 is therefore assessed, after selection via the word line 18a. The striplike doped zones 10a, 10b on the bottom of the insulation trenches and on the main face 3 each act as a reference or bit line, depending on their connection.

Figure 9:
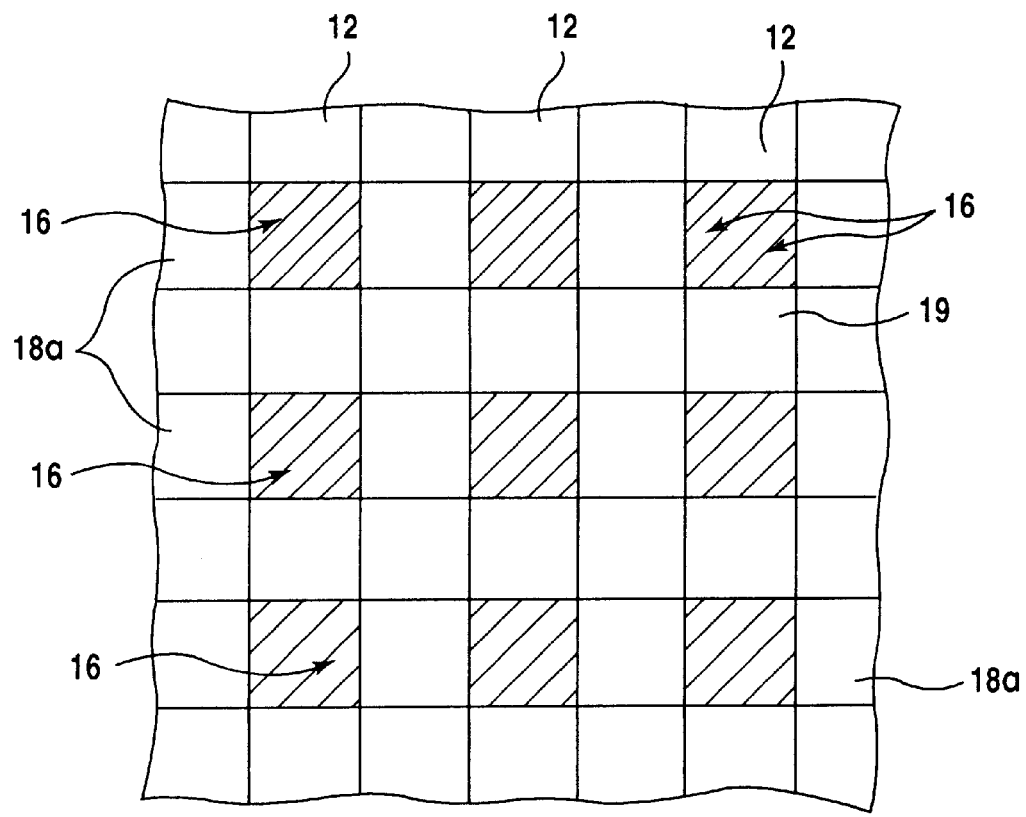
FIG. 9 is a partial plan view onto a cell field of a memory cell array according to the invention.

FIG. 9 shows a plan view on the cell field of the memory cell array of the invention. The memory cell array includes memory cells 19 in the cell field. The cell size of the memory cells 19 is shown in FIG. 9 as a dash-dotted line. The surface area requirement of a memory cell 19 in this exemplary embodiment is 2F$^2$, where F is the smallest feasible structural size that can be made with the particular lithography process employed.

We claim:

1. An electrically programmable memory cell array, comprising:

a semiconductor substrate having a main face, and a cell field with a plurality of memory cells disposed on said main face of said semiconductor substrate, said semiconductor substrate being doped, at least in a region of said cell field, with a first conductivity type, said cell field having a plurality of substantially parallel strip-shaped insulation trenches formed therein, said insulation trenches each having a bottom, said cell field having a length extending entirely across said cell field;

strip-shaped doped zones disposed between adjacent said insulation trenches on said main face, and on said bottom of said insulation trenches, said doped zones disposed on said bottom of said insulation trenches being disposed within said insulation trenches, said doped zones being doped with a second conductivity type, opposite said first conductivity type, and extending substantially parallel to said insulation trenches, said doped zones extending entirely across said length of said cell field;

said insulation trenches being filled with insulating material forming a planar surface on said main face of said semiconductor substrate;

each of said memory cells being disposed on mutually opposite edges of said insulation trenches;

said memory cells including at least one MOS transistor having a gate electrode disposed vertically relative to said main face, said MOS transistor having a gate dielectric formed of a material with charge carrier traps;

word lines extending transversely to said insulation trenches, each of said word lines connected to said gate electrode of a respective said vertical MOS transistor disposed below a respective said word line;

each of said memory cells formed with a hole extending from one edge of one of said insulation trenches inward into said insulation trench, whose surface being provided with said gate dielectric, said hole being filled with said gate electrode such that said strip-shaped doped zones adjoining the edge form source/drain zones of said vertical MOS transistor; and said doped zones disposed on said main face and on said bottom of said insulation trenches connecting respective source/drain zones of said vertical transistors disposed adjacent to one another along an edge of a respective one of said insulation trenches.

2. The memory cell array according to claim 1, wherein a spacing between mutually adjacent insulation trenches is substantially equal to a width of said insulation trenches; and each two said memory cells disposed on opposite edges of a respective insulation trench share one common hole extending over an entire width of said insulation trench.

3. The memory cell array according to claim 1, wherein said gate dielectric of said MOS transistor comprises a dielectric multiple layer with at least a first layer and a second layer, said first layer having an increased charge carrier trapping cross section relative to said second layer.

4. The memory cell array according to claim 3, wherein said first layer with the increased charge carrier trapping cross section includes one or more materials selected from the group consisting of $Si_3N_4$, $Ta_2O_5$, $Al_2O_3$ and $TiO_2$; and said second layer includes one or more materials selected from the group consisting of $SiO_2$, $Si_3N_4$ or $Al_2O_3$.

5. The memory cell array according to claim 1, wherein said gate dielectric of said MOS transistors includes a dielectric layer having foreign atoms incorporated therein, said foreign atoms having an increased charge carrier trapping cross section relative to said dielectric layer.

6. The memory cell array according to claim 5, wherein said dielectric layer is an $SiO_2$ layer; and said foreign atoms include at least one element selected from the group consisting of W, Pt, Cr, Ni, Pd, Si and Ir.

* * * * *